United States Patent [19]

Colvin et al.

[11] Patent Number: 5,224,356
[45] Date of Patent: Jul. 6, 1993

[54] METHOD OF USING THERMAL ENERGY ABSORBING AND CONDUCTING POTTING MATERIALS

[75] Inventors: David P. Colvin, Apex; Yvonne G. Bryant; James C. Mulligan, both of Raleigh, all of N.C.

[73] Assignee: Triangle Research & Development Corp., Raleigh, N.C.

[21] Appl. No.: 738,847

[22] Filed: Sep. 30, 1991

[51] Int. Cl.$^5$ .............................. H05K 7/10
[52] U.S. Cl. .................. 62/259.2; 165/80.2; 361/381; 361/388; 174/15.2
[58] Field of Search ............ 361/381, 382, 387, 388; 174/15.1, 15.2; 62/259.2, 457.2; 165/80.2

[56] References Cited

U.S. PATENT DOCUMENTS

| | | | |
|---|---|---|---|
| 3,549,783 | 12/1970 | Bendrick | 174/59 |
| 3,749,962 | 7/1973 | Smith et al. | 165/60 |
| 4,911,232 | 3/1990 | Colvin et al. | 165/104.17 |
| 4,915,167 | 4/1990 | Altoz | 165/185 |
| 5,007,478 | 4/1991 | Sengupta | 165/104.11 |
| 5,060,114 | 10/1991 | Feinberg et al. | 361/388 |
| 5,070,040 | 12/1991 | Pankoue | 361/381 |

Primary Examiner—Albert J. Makay
Assistant Examiner—William C. Doerrler
Attorney, Agent, or Firm—Rosenthal & Putterman

[57] ABSTRACT

A method of using microencapsulated thermal conducting absorbing materials to cool heat sources is disclosed. Also disclosed are microcapsules containing a thermal energy conducting material. According to the method, these materials may be used alone or as a mixture and may be employed as a powder or incorporated into a hardenable matrix such as an epoxy resin.

23 Claims, 2 Drawing Sheets

METHOD OF USING THERMAL ENERGY ABSORBING AND CONDUCTING POTTING MATERIALS

This invention was made with Government support under contract No. F33615-86-C3430 awarded by the United States Air Force. The Government has certain rights in this invention.

FIELD OF THE INVENTION

This invention relates generally to the field of potting compounds and more particularly to a method of using potting materials that include microcapsules filled with a thermal storage material for the passive cooling of electronic components.

BACKGROUND OF THE INVENTION

It is well known to cool electronic components and assemblies in order to extend their operating life and to prevent component failure. Several techniques are commonly employed to cool electronic components such a attaching the component to a heat sink which can then reject heat by means of thermal radiation and convection. Another method which is often used in combination with heat sinks is to circulate air around the component by mounting a fan or blower proximate the component to be cooled. Another method of cooling components is to surround them with potting compounds or conformal coatings which also protect them from the deleterious effects of contact with water and/or excessive shock. The potting compound is usually a semi-flexible epoxy with a thixotropic agent and a curing agent added. The particular epoxy used usually depends on a number of parameters, including the thermal coefficient of expansion of the component. The thermal coefficient of expansion of the epoxy should be close to that of the electronic component so as to prevent possible breakage thereof. Other considerations are that the epoxy should be waterproof and that it not react electrically or physically with the components.

To date, however, no method of using a potting compound has been formulated which, while preserving electrical insulation and the aforementioned benefits of protection from water and shock, also enhances the conductance of thermal energy away from the component.

With the foregoing in mind, it is an object of the present invention to provide a method of using a potting compound in which the present benefits of potting compounds, namely, providing a degree of waterproofing and shock protection are maintained, and in addition provides electrical insulation and enhanced thermal conductance of heat away from the electronic components.

SUMMARY OF THE INVENTION

The foregoing objects of the present invention are accomplished by a new method of enhancing thermal conductance of thermal energy away from an object to be cooled. According to the method, a plurality of microcapsules in the form of a powder and having a shell and containing an enhanced thermal energy absorbing material are placed in contacting relation with the object to be cooled. The components are cooled as the thermal energy generated thereby is absorbed by the thermal energy absorbing material.

In another aspect of the invention, a plurality of insulated microcapsules having an electrically insulating shell and containing a thermal energy conducting material is mixed with the microcapsules that contain a thermal energy absorbing means.

Still another aspect of the invention resides in the formation of a solid potting material wherein the thermal energy absorbing microcapsules and the thermal energy conducting microcapsules may be mixed in the desired proportions and embedded in a base material, such as a hardenable epoxy resin.

BRIEF DESCRIPTION OF THE DRAWINGS

Some of the features and advantages of the invention having been briefly stated, others will appear from the detailed description which follows, when taken in connection with the accompanying drawings in which—

DETAILED DESCRIPTION OF THE ILLUSTRATED EMBODIMENTS

Figure 1:
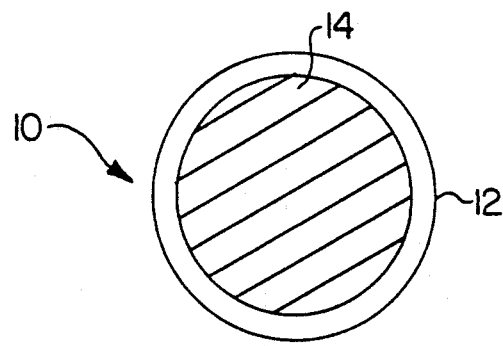
FIG. 1 is a cross section of a microcapsule.

While the present invention will be described more fully hereinafter with reference to the accompanying drawings, in which particular embodiments are shown, it is to be understood at the outset that persons skilled in the art may modify the invention herein described while still achieving the favorable results of this invention. Accordingly, the description which follows is to be understood as a broad teaching disclosure directed to persons of skill in the appropriate arts and not as limiting upon the present invention.

Referring now to the drawings, this invention is directed to a method of using thermal energy absorbing materials for cooling electronic components or other sources of thermal energy. The present invention has been shown to be effective in lowering the temperature of electronic components and particularly components that are transiently pulsed, thereby producing bursts of thermal energy. A pulsed component, rather than being on for extended periods of time is turned on for short time periods, during which it tends to get extremely hot. It is, therefore, desirable to conduct as much of the thermal energy as possible away from the component as quickly a possible in order to cool the component for the next pulse. Also, it will be understood that the technology herein disclosed can be used to cool any source of transient or pulsed energy and that the electronic component was chosen as being an illustrative example only.

In a first embodiment of the invention enhanced thermal energy absorption is accomplished by embedding a plurality of microcapsules 10 in a base material.

The microcapsules range in size from about one to about 100 microns and are formed according to the methods described in any one of the following texts to which the reader is referred for an explanation on how to fabricate microcapsules:

Books on Microencapsulation:

1. Vandergaer, J. E., Ed: Microencapsulation: Processes and Applications. Plenum Press, New York, 1974.
2. Gutcho, M. H.: Microcapsules and Microencapsulation Techniques. Noyes Data Corp., Park Ridge, N.J., 1976.
3. Ranney, M. W.: Microencapsulation Technology. Noyes Development Corp., Park Ridge, N.J., 1969.
4. Kondo, A.: Microcapsule Processing and Technology. Marcel Dekker, Inc., New York, 1979.
5. Nixon, J. R.: Microencapsulation. Marcel Dekker, Inc., New York, 1976.

Articles on Microencapsulation:

1. Sparks, R. E.: "Microencapsulation", Kirk-Othmer Encyclopedia of Chemical Technology, Vol. 15, 3rd Edition, John Wiley and Sons, Inc., 1981.
2. Thies, C.: "Physicochemical Aspects of Microencapsulation," Polym. Plast. Technol. Eng., Vol. 5, 7 (1975).
3. Thies, C.: "Microencapsulation", McGraw-Hill Yearbook of Science and Technology, 1979, pp. 13-21.
4. Herbig, J. A.: "Microencapsulation", Encyclopedia of Polymer Science and Technology, Vol. 8, 719 (1968).

The microcapsules are integral with and are dispersed throughout the base material. The microcapsules comprise an outer shell 12 and contain a thermal energy absorbing material 14 and as previously stated, range in diameter from about 1.0 to about 100 microns. The shell 12 may be composed of electrically insulating materials such as polymers, e.g. polyamides, or non-insulating materials such as metals, e.g. silver, gold, copper, nickel, or cobalt, depending on the specific application. The microcapsules contain a thermal energy absorbing material such as paraffins or eutectic metals and may be selected to change phase to obtain optimum thermal absorbing properties for a given operating temperature.

In operation, the thermal energy (in the form of heat) created by an electronic component when it is pulsed, is quickly absorbed by the thermal energy absorbing material 14. The preferred form of the thermal energy absorbing material 14 is a particle that undergoes a phase change or reversible latent heat of fusion transition upon heating or cooling. For example, one such series of compounds is a phase change material such as a homologous series of paraffinic hydrocarbons which have a melting point that is directly related to the number of carbon atoms as shown in the following table:

| Compound Name | Number of Carbon Atoms | Melting Point Degrees Centigrade |
| --- | --- | --- |
| n-Octacosane | 28 | 61.4 |
| n-Heptacosane | 27 | 59.0 |
| n-Hexacosane | 26 | 56.4 |
| n-Pentacosane | 25 | 53.7 |
| n-Tetracosane | 24 | 50.9 |
| n-Tricosane | 23 | 47.6 |
| n-Docosane | 22 | 44.4 |
| n-Heneicosane | 21 | 40.5 |
| -continued | | |
| Compound Name | Number of Carbon Atoms | Melting Point Degrees Centigrade |
| n-Eicosane | 20 | 36.8 |
| n-nonadecane | 19 | 32.1 |
| n-Octadecane | 18 | 28.2 |
| n-Heptadecane | 17 | 22.0 |
| n-Hexadecane | 16 | 18.2 |
| n-Pentadecane | 15 | 10.0 |
| n-Tetradecane | 14 | 5.9 |
| n-Tridecane | 13 | −5.5 |

Each of the above materials is separately encapsulated and is most effective near the melting point indicated where the high latent energy of phase change can be utilized. It will be seen from the foregoing that the effective temperature range of the thermal energy absorbing material 14 can, therefore, be tailored to a specific environment by selecting the phase change materials required for the corresponding temperature and adding microcapsules containing the material to the base material. In addition, appropriate materials can be first mixed before microencapsulation to provide temperature ranges intermediate of those shown above.

In addition, plastic crystals such as 2,2-dimethyl-1,3-propanediol (DMP) and 2-hydroxymethyl-2-methyl-1,3-propanediol (HMP) and the like may be used as the thermal energy absorbing material 14. When plastic crystals absorb or release thermal energy, the molecular structure is temporarily modified without changing the phase of the material. Also, it is unnecessary to encapsulate plastic crystals as they are generally not electrically conductive and remain solid when absorbing energy.

Figure 2:
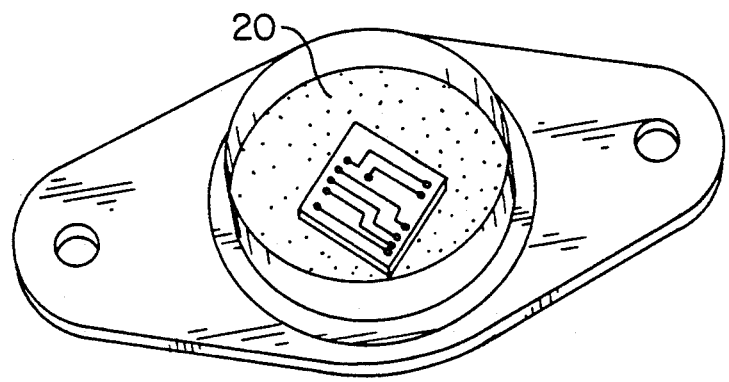
FIG. 2 illustrates an electronic component positioned within a container and surrounded by a powder containing microcapsules according to the present invention.
Figure 3:
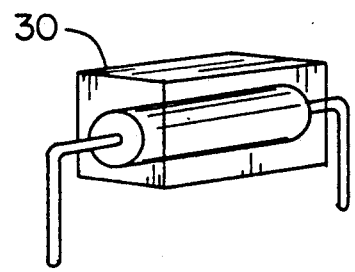
FIG. 3 illustrates an electronic component embedded within a solidified base material, or potting compound, containing microcapsules according to the present invention.

The microcapsules 10 as described above may be used solely as a powder 20 as shown in FIG. 2 or may be mixed into a base material such as a hardenable epoxy resin. In use, the epoxy resin is mixed with the microcapsules to the desired concentration. The mixture 30 can then be poured into an energy transferring direct contacting relation with the component and allowed to cure as shown in FIG. 3.

In another aspect of the invention, microcapsules having an electrically insulating shell and containing a thermal energy conducting material (not illustrated) may be employed alone as a powder or in combination with a hardenable base material or potting materials described above. In addition, a mixture containing a predetermined portion of both thermal energy absorbing material and thermal energy conducting material may be formed as a powder or as a hardenable base. The thermal energy conducting material may include materials such as copper eutectic metals, or diamond and assists in accelerating the conducting of thermal energy away from the component so that it can be more quickly transferred to the thermal energy absorbing material when the mixture is placed in energy transferring contacting relation with a heat source such as an electronic component. For the foregoing application the microcapsules range in diameter from about 1.0 to about 100 microns. However, it is unnecessary to encapsulate diamond as it is not electrically conductive.

Figure 4A:
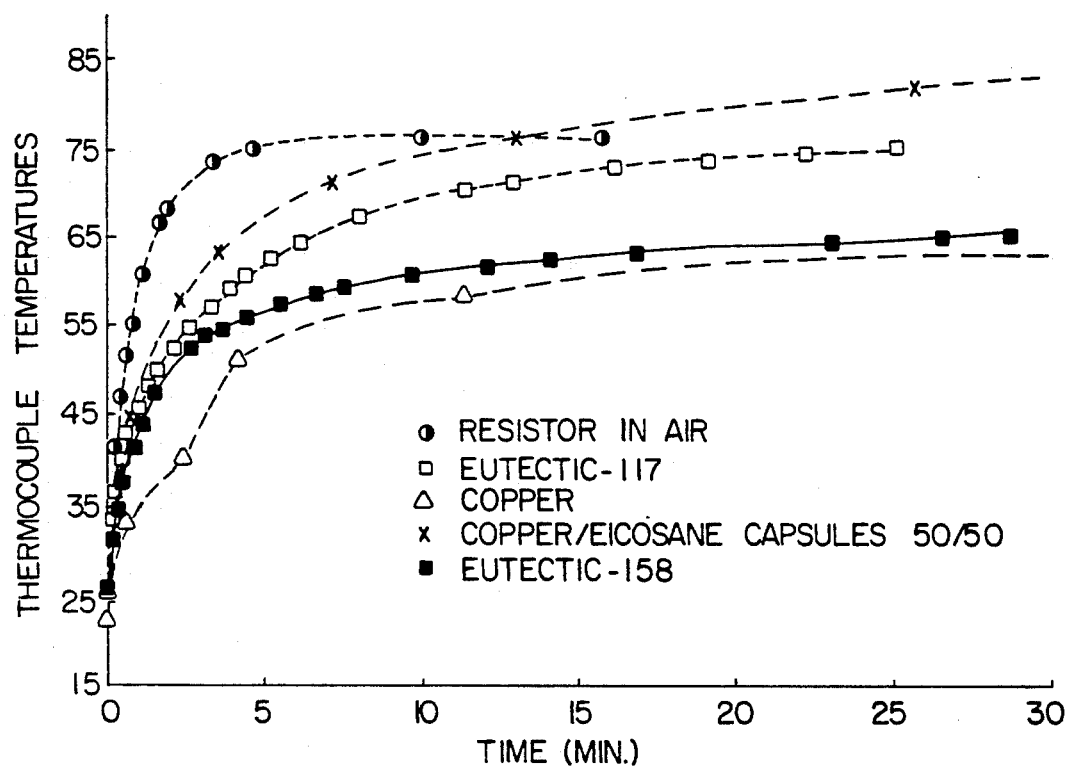
FIG. 4a illustrates the passive cooling of an electronic component in still air and various microcapsules in the form of dry powders.

FIG. 4a illustrates the results of tests that were conducted with an electronic component. The tests showed that using a pourable phase change material powder, an electronic component held within a container and surrounded in the materials could be held at significantly lower temperatures then when suspended in still air. FIG. 4a shows the time versus temperature history for various powders and a control resistor suspended in air when the same nominal level of electrical power was applied to the resistor. For one watt of power applied to the precision resistor in still air, its surface temperature increased to 80% of the steady state maximum within two or three minutes. A powdered mixture of copper and microencapsulated eicosane particles showed some improvement and reached 80% of the steady state maximum in about 15 minutes. A significant improvement was observed using copper powder microencapsulated within an electrically insulating shell which can be poured around the electrical component. Using copper microcapsules, the temperature was held at about 65% of the steady state maximum after 15 minutes.

Figure 4B:
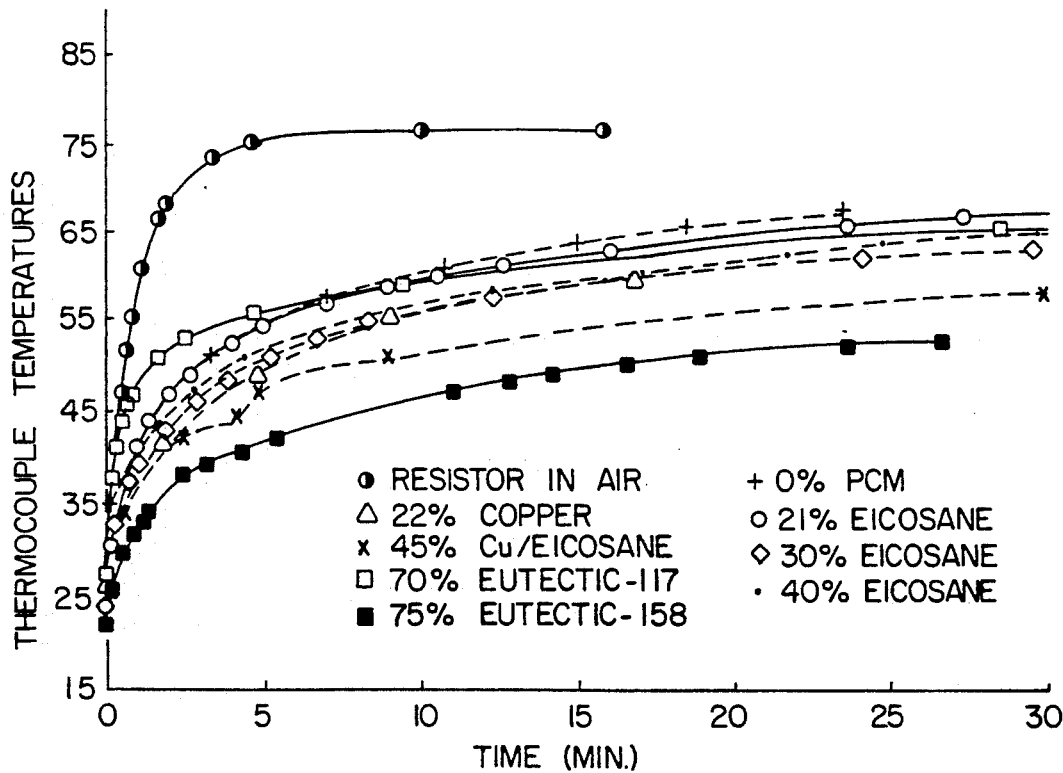
FIG. 4b illustrates the passive cooling of an electronic component in still air and various molded microcapsules containing thermal energy absorbing material and/or metals.

Further improvement in passive cooling of electronic components can also be improved by embedding the components within a molded synthetic polymer matrix. In FIG. 4b, it is seen that significantly lower temperatures are reached by embedding the resistor in either a molded block of 45% of a 50/50 cu-eicosane mixture in polyester or a 30% by weight of microencapsulated eicosane particles or 75% microencapsulated eutectic-158 particles in polyester resin. It should be noted that either of the compounds maintained the electronic component almost 30 degrees centigrade cooler for the heat dissipated than when the same component was suspended in still air. It is believed that the moldable potting materials may provide higher thermal conductance than the dry powders due to the insulative, trapped airspaces around the particles. Furthermore, if more thermally conductive molding compounds such as epoxies were used, it is believed that even greater cooling could be achieved.

The foregoing embodiments and examples are to be considered illustrative, rather than restrictive of the invention, and those modifications which come within the meaning and range of equivalence of the claims are to be included therein.

That which is claimed is:

1. A method of cooling an electronic component emitting thermal impulse energy by proximately absorbing and storing the impulse energy for subsequent removal by radiation and comprising the steps of:
   placing in contacting relation with the electronic component to be cooled, a base material and a plurality of microcapsules integral with and dispersed throughout the base material, the microcapsules containing a thermal energy absorbing material and wherein the base material is in energy absorbing contacting relation with the electronic component to be cooled, whereby the electronic component is cooled as the thermal energy generated thereby is absorbed by the thermal energy absorbing material.

2. The method according to claim 1 wherein the base material is hardenable.

3. The method according to claim 1 wherein the thermal energy absorbing material is a phase change material.

4. The method according to claim 3 wherein the phase change material is selected from the group of paraffinic hydrocarbons.

5. The method according to claim 1 wherein the thermal energy absorbing material is plastic crystals.

6. The method according to claim 2 wherein the base material is an epoxy resin.

7. A method of cooling an electronic component emitting thermal impulse energy by proximately absorbing and storing the impulse energy for subsequent removal by radiation and comprising the steps of:
   placing in contacting relation with the electronic component to be cooled, a base material and a plurality of microcapsules integral with and dispersed throughout the base material, and wherein a predetermined portion of the microcapsules contain a thermal energy absorbing material and wherein a predetermined portion of the microcapsules contain a thermal energy conducting material, the base material being in energy absorbing contacting relation with the electronic component, whereby the electronic component is cooled as the thermal energy is conducted away therefrom and is absorbed by the microcapsules.

8. The method according to claim 7 wherein the base material is hardenable.

9. The method according to claim 8 wherein the base material is an epoxy resin.

10. The method according to claim 8 wherein the microcapsules range in diameter from about 1.0 micron to about 100 microns.

11. The method according to claim 8 wherein the thermal energy absorbing material is selected from the group of phase change materials and plastic crystals.

12. The method according to claim 8 wherein the thermal energy conducting material is a metal.

13. A method of cooling an electronic component emitting thermal impulse energy by proximately absorbing and storing the impulse energy for subsequent removal by radiation and comprising the steps of:
   placing in contacting relation with the electronic component to be cooled, a plurality of microcapsules having an electrically insulating shell and containing a thermal energy absorbing material, the microcapsules being adapted to be placed in energy absorbing contacting relation with the electronic component to be cooled, whereby the object is cooled as the thermal energy generated thereby is absorbed by the thermal energy absorbing material.

14. The method according to claim 13 further including a plurality of microcapsules having a shell and containing a thermal energy conducting material.

15. The method according to claim 14 wherein the thermal energy conducting material is a metal.

16. The method according to claim 15 wherein the microcapsules range in diameter from about 1.0 microns to about 100 microns.

17. A method of cooling an electronic component emitting thermal impulse energy by proximately absorbing and storing the impulse energy for subsequent removal by radiation comprising the steps of:
   placing in contacting relation with the electronic component to be cooled, a plurality of microcapsules having an insulating shell and containing a thermal energy conducting material, whereby the electronic component is cooled as the thermal energy generated thereby is absorbed and is conducted away by the thermal conducting material.

18. The method according to claim 17 wherein the thermal energy conducting material is a metal.

19. The method according to claim 18 wherein the microcapsules range in diameter from about 1.0 microns to about 100 microns.

20. The method according to claim 19 wherein the microcapsules are embedded in a hardenable base material.

21. The method according to claim 17 wherein the thermal conducting material is a eutectic metal.

22. A method of cooling an electronic component emitting thermal impulse energy by proximately storing the impulse energy for subsequent removal by radiation and comprising the steps of:

placing in contacting relation with the electronic component to be cooled diamond dust, said diamond dust being mixed with and being dispersed throughout a plurality of microcapsules, said microcapsules containing a thermal energy absorbing and storing material, whereby the electronic component is cooled as the thermal energy generated thereby is absorbed by the diamond dust and the thermal energy absorbing and storing material.

23. A method according to claim 22 wherein the diamond dust is mixed with an dispersed throughout a hardenable base material.

* * * * *